United States Patent
Kim

(10) Patent No.: US 9,588,890 B2
(45) Date of Patent: Mar. 7, 2017

(54) ELECTRONIC DEVICE INCLUDING A SEMICONDUCTOR MEMORY AND METHOD FOR FABRICATING THE SAME

(71) Applicant: SK hynix Inc., Icheon-Si (KR)

(72) Inventor: In-Hoe Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 33 days.

(21) Appl. No.: 14/599,234

(22) Filed: Jan. 16, 2015

(65) Prior Publication Data
US 2016/0013405 A1    Jan. 14, 2016

(30) Foreign Application Priority Data

Jul. 9, 2014   (KR) .......................... 10-2014-0086132

(51) Int. Cl.
| | | |
|---|---|---|
| H01L 45/00 | (2006.01) | |
| G06F 12/08 | (2016.01) | |
| G11C 11/16 | (2006.01) | |
| H01L 43/08 | (2006.01) | |

(52) U.S. Cl.
CPC ........ *G06F 12/0802* (2013.01); *G11C 11/161* (2013.01); *H01L 43/08* (2013.01); *H01L 45/08* (2013.01); *H01L 45/1226* (2013.01); *H01L 45/1253* (2013.01); *H01L 45/146* (2013.01); *H01L 45/165* (2013.01)

(58) Field of Classification Search
CPC . H01L 45/124; H01L 45/1246; H01L 45/145; H01L 43/02; H01L 43/08
See application file for complete search history.

(56) References Cited

U.S. PATENT DOCUMENTS

| | | | | |
|---|---|---|---|---|
| 7,759,667 B2* | 7/2010 | Park | ................... | H01L 27/2409 257/3 |
| 8,860,155 B2* | 10/2014 | Min-Hwa | .............. | H01L 43/12 257/421 |
| 2008/0191188 A1* | 8/2008 | Jeong | ..................... | G11C 11/56 257/4 |
| 2013/0105756 A1* | 5/2013 | Kim | ....................... | H01L 45/06 257/2 |

FOREIGN PATENT DOCUMENTS

KR          101127766 B1      3/2012

* cited by examiner

*Primary Examiner* — Allison P Bernstein
(74) *Attorney, Agent, or Firm* — Perkins Coie LLP

(57) ABSTRACT

The disclosed technology provides an electronic device includes a semiconductor memory that includes a first contact plug over a substrate; an interlayer dielectric layer located over the first contact plug and having a hole which exposes at least a portion of the first contact plug; a first electrode layer formed along a sidewall and a bottom surface of the hole to be in contact with the first contact plug; a variable resistance layer over the first electrode layer and structured to include (1) a first portion that extends along the sidewall of the hole in a direction perpendicular to the substrate and exhibits a variable resistance and (2) a second portion that is parallel to the bottom surface of the hole and does not exhibit a variable resistance, and a second electrode layer formed over the variable resistance layer.

20 Claims, 11 Drawing Sheets

ELECTRONIC DEVICE INCLUDING A SEMICONDUCTOR MEMORY AND METHOD FOR FABRICATING THE SAME

CROSS-REFERENCE TO RELATED APPLICATION

This patent document claims priority and benefits of Korean Patent Application No. 10-2014-0086132, entitled "ELECTRONIC DEVICE INCLUDING A SEMICONDUCTOR MEMORY AND METHOD FOR FABRICATING THE SAME" and filed on Jul. 9, 2014, which is incorporated herein by reference in its entirety.

TECHNICAL FIELD

The technology disclosed in this patent document relates to memory circuits or devices and their applications in electronic devices or systems.

BACKGROUND

Recently, as electronic devices or appliances trend toward miniaturization, low power consumption, high performance, multi-functionality, and so on, there is a demand for storing information in various electronic devices or appliances such as a computer, a portable communication device, and so on, and research and development for such electronic devices have been conducted. Examples of such electronic devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device facilitates fabricating processes and can improve characteristics of a variable resistance element while increasing a degree of integration.

In one aspect, an electronic device is provided to include semiconductor memory that includes: a substrate; a first contact plug formed over the substrate; an interlayer dielectric layer located over the first contact plug and having a hole which exposes at least a portion of the first contact plug; a first electrode layer formed along a sidewall and a bottom surface of the hole to be in contact with the first contact plug; a variable resistance layer formed over the first electrode layer and structured to include (1) a first portion that extends along the sidewall of the hole in a direction perpendicular to the substrate and exhibits a variable resistance and (2) a second portion that is parallel to the bottom surface of the hole and does not exhibit a variable resistance; and a second electrode layer formed over the variable resistance layer.

In some implementations, the second portion includes a structure identical to the first portion but are added with impurities which cause a loss of the variable resistance. In some implementations, the variable resistance layer includes a first magnetic layer having a pinned magnetization direction, a second magnetic layer having a variable magnetization direction, and a tunnel barrier layer interposed between the first magnetic layer and the second magnetic layer, and the second portion includes impurities which cause a loss of a magnetic characteristic in the first and second magnetic layers. In some implementations, the impurities include Ga, Ge, As, In, P, C, Si, N or B. In some implementations, the variable resistance layer includes a metal oxide, and the second portion contains more oxygen than the first portion. In some implementations, the second portion satisfies a stoichiometric ratio. In some implementations, the second electrode layer includes a lower portion having a sidewall and a bottom surface which are surrounded by the variable resistance layer, and an upper portion located over the lower portion and having a width greater than a width of the lower portion, and portion of the first electrode layer and the variable resistance layer which are provided over the interlayer dielectric layer are aligned on their sides with a sidewall of the upper portion of the second electrode layer. In some implementations, the variable resistance layer which is located over the interlayer dielectric layer has a portion in which the variable resistance does not exist. In some implementations, top surfaces of the first electrode layer, the variable resistance layer and the second electrode layer are located at a same level as a top surface of the interlayer dielectric layer. In some implementations, the semiconductor memory further includes: a second contact plug coupled to a top surface of the second electrode layer. In some implementations, the first portion is switched between different resistance states according to a voltage or current supplied through the first electrode layer coupled to an outer sidewall of the first portion and the second electrode layer coupled to an inner sidewall of the first portion. In some implementations, the first and second portions of the variable resistance layer are formed of an identical structure which exhibits the variable resistance but are different in that the second portion includes impurities which cause a loss of the variable resistance while the first portion is substantially free of the impurities and thus maintains the variable resistance In another aspect, an electronic device is provided to include a semiconductor memory that includes: a substrate having a conductive layer; an interlayer dielectric layer located over the substrate and having a hole which exposes the conductive layer; a first electrode layer formed along a sidewall and a bottom surface of the hole; a variable resistance layer provided over the first electrode layer and including an insulating portion which is parallel to the bottom surface of the hole; and a second electrode layer formed over the variable resistance layer.

In some implementations, the variable resistance layer includes a first magnetic layer, a second magnetic layer, and a tunnel barrier layer interposed between the first magnetic layer and the second magnetic layer, and the insulating portion include impurities which cause a loss of magnetic characteristics in the first and second magnetic layers. In some implementations, the impurities include Ga, Ge, As, In, P, C, Si, N or B. In some implementations, the variable resistance layer includes a metal oxide, and the insulating portion contains more oxygen than a remaining portion of the variable resistance layer. In some implementation, the insulating portion satisfies a stoichiometric ratio. In some implementations, the first electrode layer is further provided over the interlayer dielectric layer, and the variable resistance layer further includes an additional insulating portion which is provided over the interlayer dielectric layer. In some implementations, the second electrode layer includes a lower portion having a sidewall and a bottom surface which are surrounded by the variable resistance layer, and an upper portion located over the lower portion and having a width greater than a width of the lower portion, and sidewalls of portions of the variable resistance layer and the first electrode layer which are located over the interlayer dielectric layer are aligned with a sidewall of the upper portion of the second electrode layer.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In some implementations, the variable resistance layer includes an insulating bottom portion which extends in a direction parallel to the substrate and located over the bottom surface of the first electrode layer. In some implementations, the insulating portion of the variable resistance layer includes a first magnetic layer, a second magnetic layer, and a tunnel barrier layer interposed between the first magnetic layer and the second magnetic layer.

In another aspect, a method is provided for fabricating an electronic device. The method comprises a semiconductor memory includes forming a first contact plug over a substrate; forming an interlayer dielectric layer over the first contact plug; forming a hole which exposes at least a portion of the first contact plug by selectively etching the interlayer dielectric layer; forming a first electrode layer and a variable resistance material layer along a resultant structure in which the hole is formed; doping impurities which cause a loss of a variable resistance characteristic toward the variable resistance material layer in a direction substantially perpendicular to a surface of the substrate; and forming a second electrode layer filling the hole.

In another aspect, a method is provided for fabricating an electronic device. The method comprises: forming a first contact plug over a substrate; forming an interlayer dielectric layer over the first contact plug; forming a hole which exposes at least a portion of the first contact plug by selectively etching the interlayer dielectric layer; forming a first electrode layer along a resultant structure of the interlayer dielectric layer with the hole; forming a variable resistance material layer over the first electrode layer that exhibits a variable resistance; doping impurities into the variable resistance material layer in a direction substantially perpendicular to a surface of the substrate to cause the impurities to be present in a portion of the variable resistance material layer that is parallel to the substrate while leaving a portion of the variable resistance material layer that is perpendicular to the substrate substantially free of the impurities, where the impurities cause loss of the variable resistance in the variable resistance material layer; forming a second electrode layer over the variable resistance material layer after the doping; and patterning the variable resistance material layer, the first electrode layer, and the second electrode layer such that the first electrode layer, variable resistance material layer and the second electrode layer are aligned at their edge sides.

In some implementations, the forming of the variable resistance material layer includes sequentially forming a first magnetic layer, a tunnel barrier layer and a second magnetic layer, and the impurities cause the first and second magnetic layers of the variable resistance material layer to lose their magnetic characteristic. In some implementations, the impurities include Ga, Ge, As, In, P, C, Si, N or B. In some implementations, the forming of the variable resistance material layer includes forming a metal oxide containing oxygen vacancies, and the impurities include oxygen. In some implementations, the forming of the second electrode layer includes: forming a conductive material covering the variable resistance material layer including the portion doped with the impurities; forming a mask pattern over the conductive material, the mask pattern overlapping with the hole and having a width greater than a width of the hole; and etching the conductive material using the mask pattern as an etching barrier. In some implementations, the forming of the second electrode layer includes: forming a conductive material covering the variable resistance material layer including the portion doped with the impurities; and performing a planarization process until a top surface of the interlayer dielectric layer is exposed, and portions of the first electrode layer and the variable resistance material layer which are located over the interlayer dielectric layer are removed during the planarization process.

These and other aspects, implementations and associated advantages are described in greater detail in the drawings, the description and the claims.

DETAILED DESCRIPTION

Figure 1:
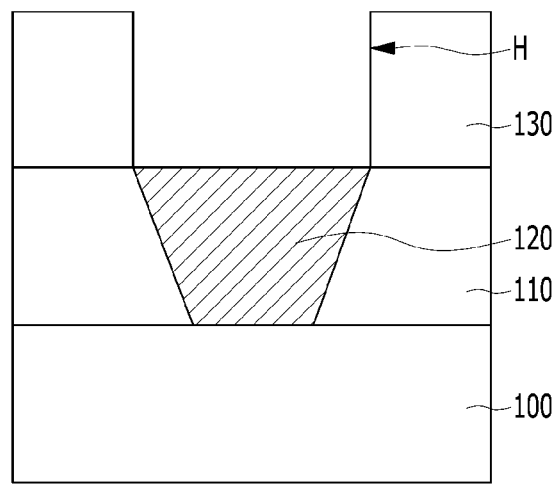
FIGS. 1 through 7 are views explaining an example of a semiconductor device and an example of a method for fabricating the same in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1 to 7 are views explaining an example of a semiconductor device and an example of a method for fabricating the same in accordance with an implementation of the disclosed technology. Specifically, FIGS. 1 to 5A, 6 and 7 are cross-sectional views, and FIG. 5B is a perspective view showing parts of components of FIG. 5A. Also, FIGS. 8A to 9B are views explaining examples of a variable resistance layer included in the semiconductor device in accordance with the implementation. Specifically, FIGS. 8A to 9B are enlarged-views of a portion A of FIGS. 2 and 3.

First, the fabricating method is described.

Referring to FIG. 1, a substrate 100 including a specific structure (not shown) may be provided.

For example, the specific structure may include an access element or selection element which is coupled to the variable resistance element and controls a supply of a current or voltage to the variable resistance element. The access element may include a transistor, or a diode, etc.

A first interlayer dielectric layer 110 may be formed over the substrate 100. A first contact plug 120 may be formed, which penetrates through the first interlayer dielectric layer 110 to be coupled to a portion, for example, the access element, of the substrate 100.

The first interlayer dielectric layer 110 may include an insulating material such as an oxide, or a nitride, etc. The first contact plug 120 may be provided under the variable resistance element and serve as a path for supplying a current or voltage to the variable resistance element. The first contact plug 120 may include a conductive material, such as a metal, or a metal nitride, etc. The first contact plug 120 may be formed by selectively etching the first interlayer dielectric layer 110 to form a hole exposing the portion of the substrate 100 and filling the hole with the conductive material.

A second interlayer dielectric layer 130 may be formed over the first interlayer dielectric layer 110 and the first contact plug 120. Then, a hole H exposing a top surface of the first contact plug 120 may be formed by selectively etching the second interlayer dielectric layer 130.

The second interlayer dielectric layer 130 may include an insulating material such as an oxide, or a nitride, etc. In this implementation, the hole H overlaps with the first contact plug 120 in a plan view and has the same width as the first contact plug 120 in a horizontal direction parallel to a surface of the substrate 100. However, other implementations are also possible. A width of the hole H may be variously modified as long as the hole H exposes at least a portion of the first contact plug 120. The hole H may have a sidewall and a bottom surface. The sidewall of the hole H may be inclined at a perpendicular angle or a non-perpendicular angle close to the perpendicular angle with respect to the surface of the substrate 100. The bottom surface of the hole H may be substantially parallel to the surface of the substrate 100.

Figure 2:
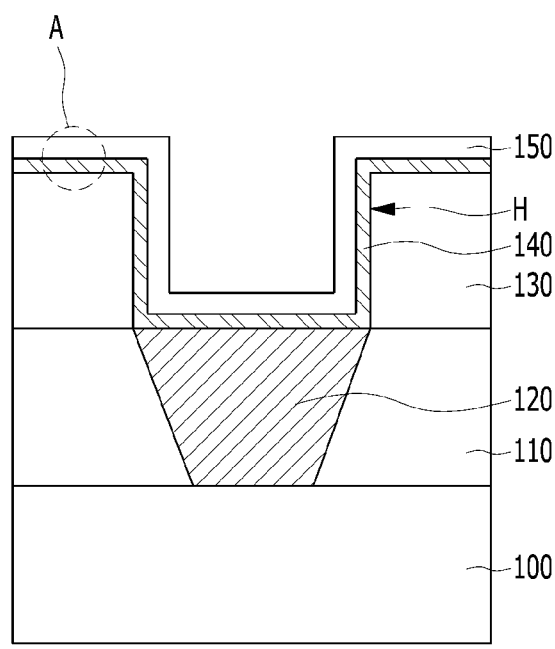

Referring to FIG. 2, a first electrode layer 140 and a variable resistance material layer 150 may be sequentially formed along a resultant structure of FIG. 1.

The first electrode layer 140 and the variable resistance material layer 150 may be formed by a deposition method which has an excellent step coverage characteristic, for example, an ALD (Atomic Layer Deposition) method. Alternately, the first electrode layer 140 and the variable resistance material layer 150 may be formed by a deposition method such as CVD (Chemical Vapor Deposition), PVD (Physical Vapor Deposition), and so on. Also, a sum of thicknesses of the first electrode layer 140 and the variable resistance material layer 150 may be relatively small so as not to fill the hole H. As a result, each of the first electrode layer 140 and the variable resistance material layer 150 may include a horizontal portion which is located over a top surface of the second interlayer dielectric layer 130 and the bottom surface of the hole H and is substantially parallel to the surface of the substrate 100. The vertical portion is located over the sidewalls of the hole H and forms a certain angel, for example, a perpendicular angle with regard to the surface of the substrate 100. A bent portion may be provided between the horizontal portion and the vertical portion. In FIG. 1, parts of the horizontal portions of the first electrode layer 140 and the variable resistance material layer 150 are represented by A.

The first electrode layer 140 may be interposed between the variable resistance material layer 150 and the first contact plug 120 and serve to transfer a current or voltage from the first contact plug 120 to the variable resistance material layer 150. The first electrode layer 140 may include a conductive material. For example, the first electrode layer 140 may include a metal such as Ti, Ta, Cu, W, Al, Pt, Au, Ag, Ni, Hf, or La, etc., or a metal nitride such as HfN, TiN, or TaN, etc. The first electrode layer 140 may be formed of or include a material which is the same as that of the first contact plug 120.

The variable resistance material layer 150 may include a material which can be switched between different resistance states according to a current or voltage supplied thereto. For example, the variable resistance material layer 150 may include one of various variable resistance materials that are used in an RRAM, a PRAM, an FRAM, or an MRAM, etc. The variable resistance materials may include a metal oxide such as a transition metal oxide or a perovskite-based material, a phase change material such as a chalcogenide-based material, a ferroelectric material, or a ferromagnetic material, etc. The variable resistance material layer 150 may have a single-layered structure. Alternatively, the variable resistance material layer 150 may have a multi-layered structure in which two or more layers are combined to show a variable resistance characteristic.

Figure 8A:
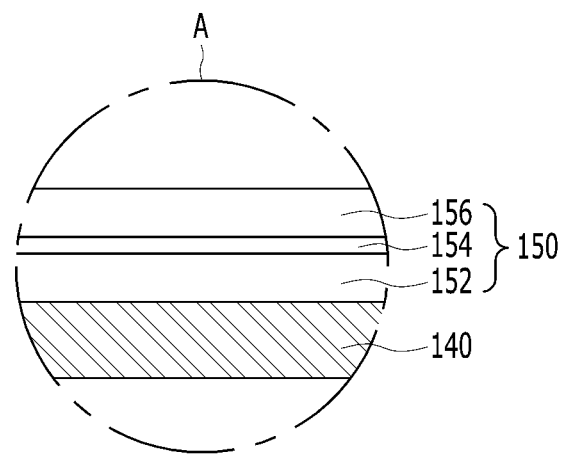
FIGS. 8A through 9B are views explaining examples of a variable resistance layer included in the semiconductor device in accordance with the implementation.

For example, as shown in FIG. 8A, the variable resistance material layer 150 may include an MTJ (Magnetic Tunnel Junction) structure which includes a first magnetic layer 152, a second magnetic layer 156 and a tunnel barrier layer 154 interposed between the first magnetic layer 152 and the second magnetic layer 156. Since FIG. 8A is the enlarged view of the portion A of FIG. 2, the first magnetic layer 152, the second magnetic layer 156 and the tunnel barrier layer 154 are illustrated as extending in the horizontal direction. However, the first magnetic layer 152, the second magnetic layer 156 and the tunnel barrier layer 154 which are located over the sidewall of the hole H may extend in a vertical direction.

Each of the first magnetic layer 152 and the second magnetic layer 156 may have a single-layered structure or a multi-layered structure including a ferromagnetic material, such as an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. One of the first and second magnetic layer 152 and 156 may have a variable magnetization direction to serve as a free layer or a storage layer, and the other of the first and second magnetic layer 152 and 156 may have a pinned magnetization direction to serve as a pinned layer or a reference layer. The tunnel barrier layer 154 may function to change the magnetization direction of the free layer by tunneling of electrons. The tunnel barrier layer 154 may have a single-layered structure or a multi-layered structure including an oxide such as $Al_2O_3$, MgO, CaO, SrO, TiO, VO, or NbO, etc.

When the magnetization directions of the first and second magnetic layers 152 and 156 are parallel to each other, the variable resistance material layer 150 may exhibit a low resistance state and store a data bit value of "0" (a low data bit value). On the other hand, when the magnetization directions of the first and second magnetic layers 152 and 156 are anti-parallel to each other, the variable resistance material layer 150 may exhibit a high resistance state and store a data bit value of "1" (a high data bit value). The variable resistance material layer 150 may include additional layers for improving characteristics of the variable resistance material layer 150 in addition to the MTJ structure.

Figure 9A:
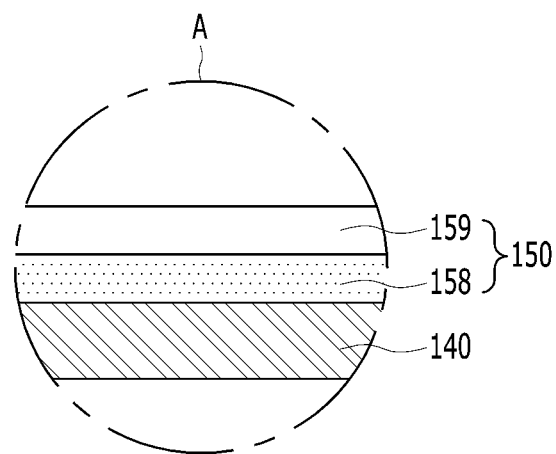

Alternately, the variable resistance material layer 150 may include a metal oxide containing oxygen vacancies. In this case, the variable resistance material layer 150 may be switched between different resistance states by movements of the oxygen vacancies. For example, as shown in FIG. 9A, the variable resistance material layer 150 may include a stacked-structure including a first metal oxide layer 158 and a second metal oxide layer 159. Here, the first metal oxide layer 158 may be, or may include, an oxygen-rich metal oxide layer and the second metal oxide layer 159 may be, or may include, an oxygen-deficient metal oxide layer, or vice versa. Since FIG. 9A is the enlarged view of the portion A of FIG. 2, the first and second metal oxide layers 158 and 159 are illustrated as extending in the horizontal direction. However, the first and second metal oxide layers 158 and 159 which are located over the sidewall of the hole H may extend in the vertical direction.

The first metal oxide layer 158 may include a material which satisfies a stoichiometric ratio, such as $TiO_2$ or $Ta_2O_5$. The second metal oxide layer 159 may include a material that is deficient in oxygen compared to a material that satisfies a stoichiometric ratio, such as $TiO_x$ (where x is smaller than 2), or $TaO_y$ (where y is smaller than 2.5).

When oxygen vacancies of the second metal oxide layer 159 are supplied to the first metal oxide layer 158, filament current paths due to the oxygen vacancies are formed in the first metal oxide layer 158. In this case, the variable resistance material layer 150 may exhibit a low resistance state and store the low data bit value "0". On the other hand, when the oxygen vacancies of the second metal oxide layer 159 are not supplied into the first metal oxide layer 158, the filament current paths formed in the first metal oxide layer 158 disappear. In this case, the variable resistance material layer 150 may exhibit a high resistance state and store the high data bit value "1". The variable resistance material layer 150 may include additional layers for improving characteristics of the variable resistance material layer 150 in addition to the first and second metal oxide layers 158 and 159. Although the first metal oxide layer 158 is located over the second metal oxide layer 159 in this implementation, positions of the first metal oxide layer 158 and the second metal oxide layer 159 may be reversed with each other.

Figure 3:
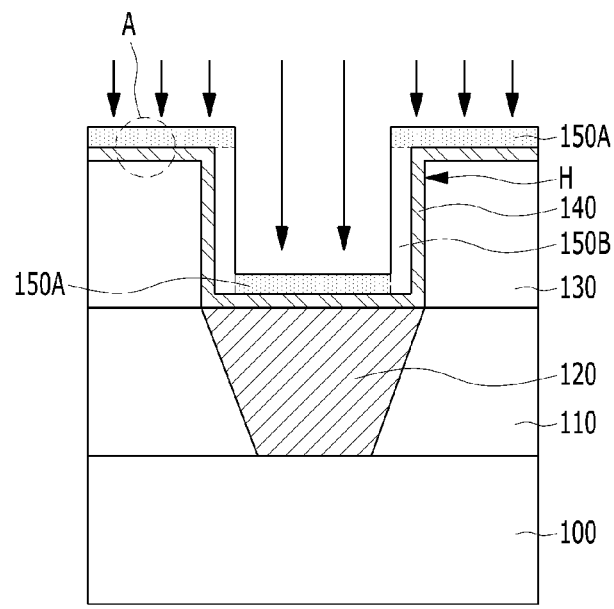

Referring to FIG. 3, impurities can be provided for deactivating the variable resistance material layer 150 by eliminating the variable resistance property and may be doped to a resultant structure of FIG. 2 in a direction toward the variable resistance material layer 150, that is, in a downward direction from top to bottom. Here, the deactivating of the variable resistance material layer 150 causes the variable resistance material layer 150 to lose variable resistance characteristics and have an insulating characteristic. The doping of the impurities may be performed by an ion-implantation method, etc.

As a result of doping the impurities, the horizontal portion of the variable resistance material layer 150 may lose its variable resistance characteristic. On the other hand, the vertical portion of the variable resistance material layer 150 may maintain its variable resistance characteristic. As illustrated in FIG. 3, since the impurity doping is performed in the downward direction, the impurities are not, or are less likely, doped into the vertical portion of the variable resistance material layer 150. Thus, only the vertical portion of the variable resistance material layer 150 may preserve its variable resistance property and thus can serve or function as a variable resistance element. Hereinafter, the horizontal portion of the variable resistance material layer 150 doped with the impurities may be referred to as a deactivated region 150A, and the vertical portion of the variable resistance material layer 150 may be referred to as an active region 150B.

Figure 8B:
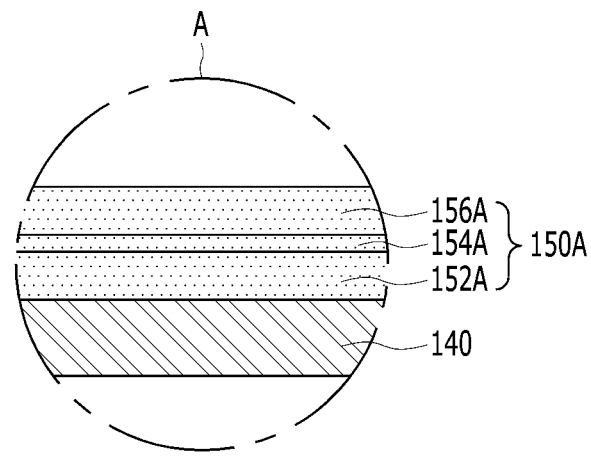

When the impurity doping is performed in the variable resistance material layer 150 including the MTJ structure as shown in FIG. 8A, the impurities may cause the first and second magnetic layers 152 and 156 to lose their magnetic characteristics. For example, the impurities may include a non-magnetic material such as Ga, Ge, As, In, P, C, Si, N or B, etc. FIG. 8B shows the variable resistance material layer 150 including the MTJ structure, which is obtained after the impurity doping. As shown in FIG. 8B, the deactivated region 150A may include a first magnetic layer 152A doped with the impurities, a second magnetic layer 156A doped with the impurities, and a tunnel barrier layer 154A doped with the impurities. Since the first and second magnetic layers 152A and 156A lose their magnetic characteristics due to the impurities, the deactivated region 150A cannot exhibit the variable resistance characteristics. On the other hand, the active region 150B which corresponds to the vertical portion of the variable resistance material layer 150 and is not doped with impurities may maintain a layered-structure same as that of FIG. 8A.

Figure 9B:
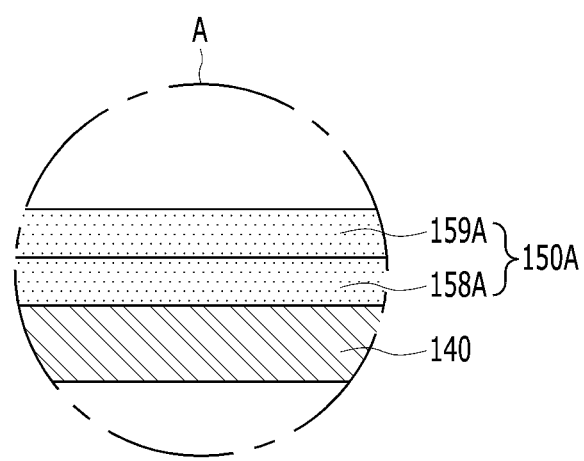

Alternatively, when the impurity doping containing oxygen is performed in the variable resistance material layer 150 including the metal oxide as shown in FIG. 9A, the impurities containing oxygen can cause the second metal oxide layer 159 to lose the oxygen vacancies. FIG. 9B shows the variable resistance material layer 150 including the metal oxide, which is obtained after the impurity doping. As shown in FIG. 9B, the deactivated region 150A may include a first metal oxide layer 158A doped with oxygen and a second metal oxide layer 159A doped with oxygen. By the oxygen doping, oxygen vacancies that are necessary to change its resistance state become deficient or does not exist in the second metal oxide layer 159A. Thus, the second metal oxide layer 159A may satisfy a stoichiometric ratio. In this case, the deactivated region 150A cannot exhibit the variable resistance characteristics. On the other hand, the active region 150B which corresponds to the vertical portion of the variable resistance material layer 150 and is not doped with impurities may maintain a layered-structure same as that of FIG. 9A.

Figure 4:
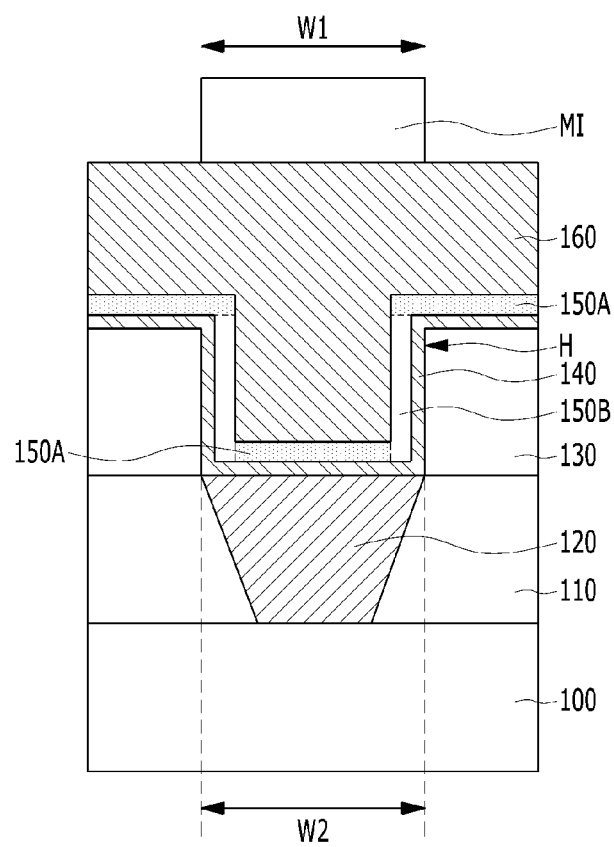

Referring to FIG. 4, a second electrode layer 160 may be formed over a resultant structure of FIG. 3 by depositing a conductive material to a thickness that is sufficient to fill the hole H. To obtain a flat top surface of the second electrode layer 160, a planarization process, for example, a CMP (Chemical Mechanical Polishing) process may be performed after the forming of the second electrode layer 160.

The second electrode layer 160 may be interposed between the variable resistance material layer 150 and a second contact plug which will be described later and function to transfer a current or voltage from the second contact plug to the variable resistance material layer 150. The second electrode layer 160 may include a conductive material. For example, the second electrode layer 160 may include a metal such as Ti, Ta, Cu, W, Al, Pt, Au, Ag, Ni, Hf, or La, etc, or a metal nitride such as HfN, TiN, or TaN, etc.

Then, a mask pattern M1 overlapping with the hole H may be formed over the second electrode layer 160. Here, a width W1 of the mask pattern M1 may be greater than a width W2 of the hole H in the horizontal direction. Therefore, the mask pattern M1 may cover a portion of the deactivated region 150A located over the second interlayer dielectric layer 130 and a portion of the first electrode layer 150 located over the second interlayer dielectric layer 130.

Figure 5A:
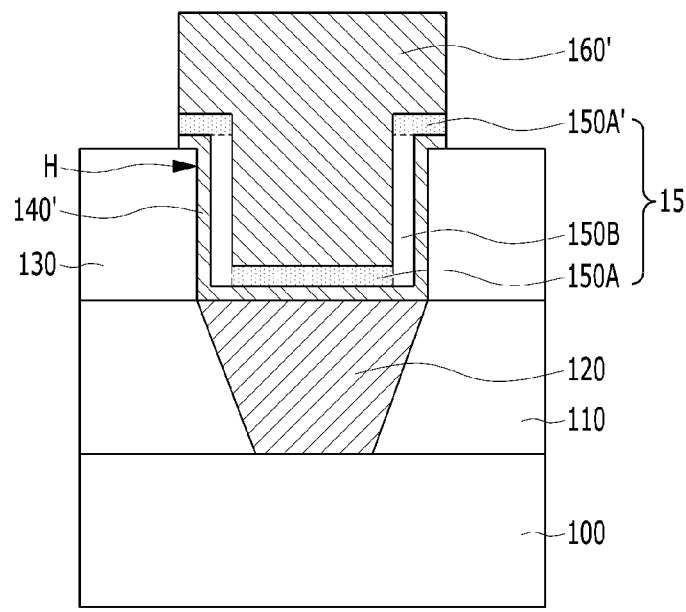
Figure 5B:
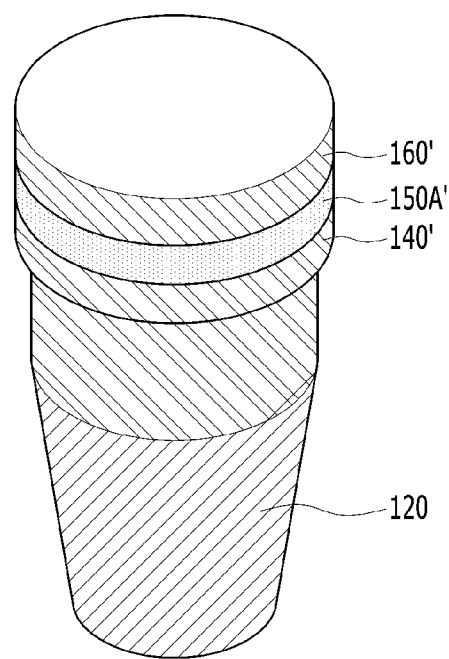

Referring to FIGS. 5A and 5B, the second electrode layer 160, the deactivated region 150A and the first electrode layer 140 which are located over the second interlayer dielectric layer 130 may be etched using the mask pattern M1 as an etching barrier. The etched second electrode layer, the etched deactivated region and the etched first electrode layer are represented by reference numerals 160', 150A' and 140', respectively. The deactivated region 150A and 150A' and the active region 150B may be referred to as a variable resistance layer 15.

As a result of the etching process, the portions of the first electrode layer 140', the variable resistance layer 15, and the second electrode layer 160', which are positioned above the second interlayer dielectric layer 130, are aligned with one another. Further, each of the first electrode layer 140' and the variable resistance layer 15 has a bent portion at their edges. The first electrode layer 140' may be formed along the bottom surface and the sidewall of the hole H. Further, an uppermost portion of the first electrode layer 140' which is provided over the second interlayer dielectric layer 130 may surround a rim of the hole H. Also, the variable resistance layer 15 may be formed over the first electrode layer 140'. The variable resistance layer 15 may have a similar shape as the first electrode layer 140'. For example, the deactivated region 150A and 150A' may be formed over the horizontal portion of the first electrode layer 140', and the active region 150B may be formed over the vertical portion of the first electrode layer 140'.

The second electrode layer 160' may fill the hole H in which the first electrode layer 140' and the variable resistance layer 15 are formed, and a portion of the second electrode layer 160' may protrude over the second interlayer dielectric layer 130. The second electrode layer 160' includes a lower portion having a sidewall and a bottom surface which are surrounded by the variable resistance layer 15 and an upper portion located over the lower portion. A width of the upper portion of the second electrode layer 160' may be greater than a width of the lower portion of the second electrode layer 160'. The uppermost portion of the first electrode layer 140' and the deactivated region 150' located over the second interlayer dielectric layer 130 may have sidewalls aligned with a sidewall of the upper portion of the second electrode layer 160'.

Figure 6:
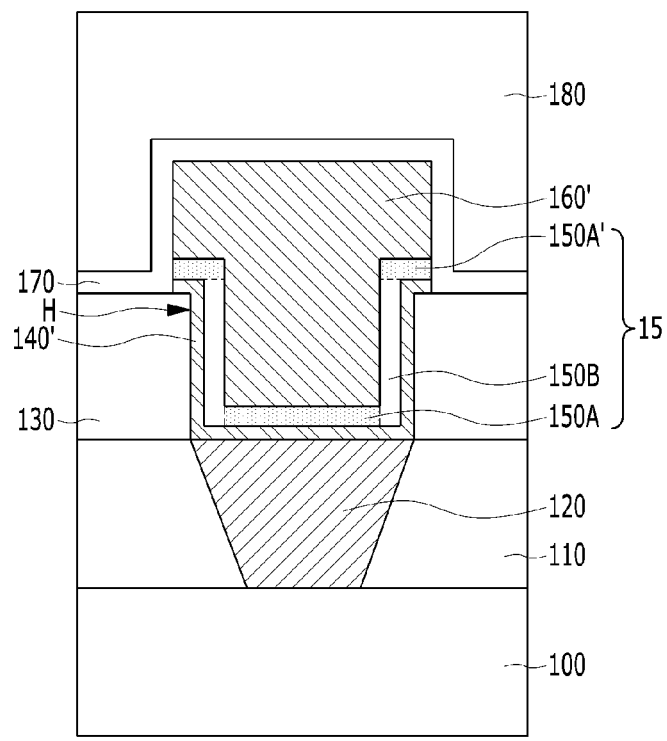

Referring to FIG. 6, a spacer 170 may be formed along a resultant structure of FIGS. 5A and 5B, and then, a third interlayer dielectric layer 180 covering the spacer 170 may be formed. The spacer 170 may serve as an etch-stopper in a subsequent process of forming a second contact plug while protecting the second electrode layer 160', the variable resistance layer 15 and the first electrode layer 140'. The spacer 170 may include an insulating material such as a nitride, etc. The third interlayer dielectric layer 180 may include an insulating material such as an oxide or another suitable insulating material which has a different characteristic and/or a different etching rate from the spacer 170. The forming of the spacer 170 may be skipped.

Figure 7:
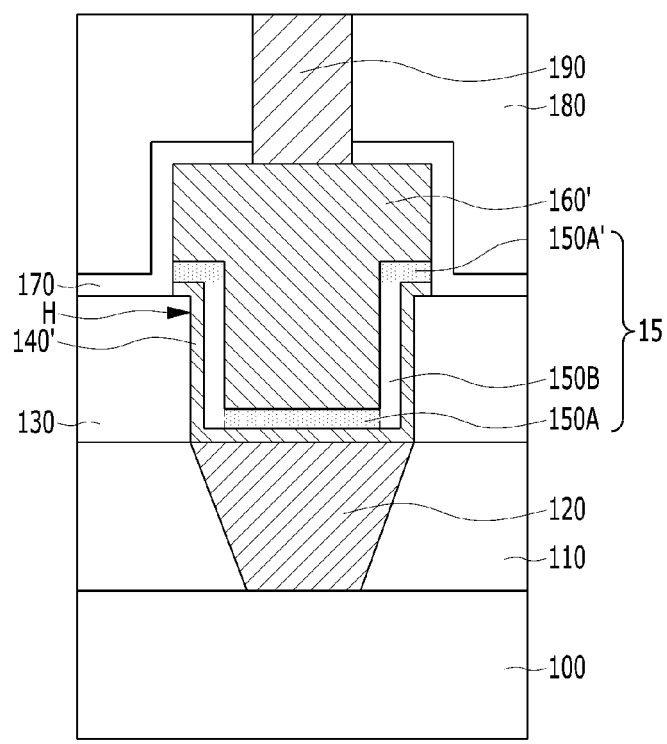

Referring to FIG. 7, a second contact plug 190 may be formed by selectively etching the third interlayer dielectric layer 180 and the spacer 170 to form a hole exposing a top surface of the second electrode layer 160', and filling the hole with a conductive material. The second contact plug 190 may be provided over the variable resistance element and serve as a path for supplying a current or voltage to the variable resistance element. The second contact plug 190 may include a conductive material, such as a metal, or a metal nitride, etc. The second contact plug 190 may include the material same as that of the second electrode layer 160'.

Then, although not shown, various subsequent processes, for example, a process of forming a bit line coupled to the second contact plug 190 may be performed.

Upon completing the aforementioned processes, the semiconductor device of FIG. 7 may be fabricated.

Referring back to FIG. 7, the semiconductor device may include the first contact plug 120, the second interlayer dielectric layer 130 which is provided over the first contact plug 120 and has the hole H exposing at least a portion of the first contact plug 120, the first electrode layer 140' which is formed along the bottom surface and the sidewall of the hole H, and the top surface of the second interlayer dielectric layer 130 corresponding the rim of the hole H, the variable resistance layer 15 which is provided over the first electrode layer 140' and formed along the first electrode layer 140', the second electrode layer 160' which fills the hole H in which the first electrode layer 140' and the variable resistance layer 15 are formed and has a portion protruding over the second interlayer dielectric layer 130, and the second contact plug 190 which is provided over the second electrode layer 160' and coupled to the second electrode layer 160'. Here, the variable resistance layer 15 includes the deactivated region 150A and 150A' and the active region 150B. The deactivated region 150A and 150A' of the variable resistance layer 15 may be located over the horizontal portion of the first electrode layer 140' and the active region 150B may be located over the vertical portion of the first electrode layer 140'

The inner sidewalls of the active region 150B of the variable resistance layer 15 may be surrounded by the sidewall of the lower portion of the second electrode layer 160'. The lower portion of the second electrode layer 160' may have a pillar-like shape. The outer sidewalls of the active region 150B of the variable resistance layer 15 may be surrounded by the first electrode layer 140'. Therefore, the active region 150B may be supplied with a required current or voltage through the second electrode layer 160' coupled to the inner sidewalls of the active region 150B and the first electrode layer 140' coupled to the outer sidewalls of the active region 150B. Under this configurations, the active region 150 B can be switched between different resistance states. Since a bottom surface of the first electrode layer 140' is coupled to the first contact plug 120 and a top surface of the second electrode layer 160' is coupled to the second contact plug 190, the first and second electrode layers 140' and 160' may function as paths for supplying a current or voltage to the active region 150B. Although the deactivated region 150A and 150A' is coupled to the first and second electrode layers 140' and 160', the resistance state of the deactivated region 150A and 150A' may not be changed because the deactivated region 150A and 150A' has lost its variable resistance characteristics.

As shown in FIG. 8A or 9A, the active region 150B may include the MTJ structure or the metal oxide. Layers included in the active region 150B may be extended in the vertical direction. The deactivated region 150A and 150A' may include the MTJ structure doped with the impurities with non-magnetic characteristics and the metal oxide doped with oxygen in FIGS. 8B and 9B, respectively.

The above implementation may be used to achieve one or more following advantages.

In a conventional process of manufacturing a variable resistance element, a bottom electrode, a variable resistance layer and a top electrode are sequentially stacked over a substrate. In this conventional process, an area of the variable resistance element should be increased to a certain level in a horizontal direction in order to satisfy the requirements of a memory cell. In this implementation, a variable resistance element is provided such that the inner sidewall of a variable resistance layer surrounds a sidewall of a pillar-shaped electrode layer, and the outer sidewall of the variable resistance layer is surrounded by another electrode layer. This structure of the variable resistance will be referred to as "all-around structure" in the below. Under this all-around structure, an area of the variable resistance element is sufficiently secured in a vertical direction. Therefore, an area of the variable resistance element may be reduced in the horizontal direction, thereby increasing a degree of integration.

Also, the fabricating method can be easier and simpler for forming the variable resistance element having the all-around structure. For example, since an active region of the variable resistance element is defined using a doping process, the active region may not be affected by an etching process. Therefore, deterioration in characteristics of the variable resistance element due to an etching damage ca be prevented. Thus, the reliable characteristics of the variable resistance element can be obtained.

Further, when a top electrode protrudes over a hole in which the variable resistance element is formed and has a greater width than the hole, an alignment margin between the top electrode and a contact plug located over the top electrode may be secured. Also, since it becomes easier to obtain the top electrode having a flat surface, an interface resistance between the top electrode and the contact plug can be reduced.

Figure 10:
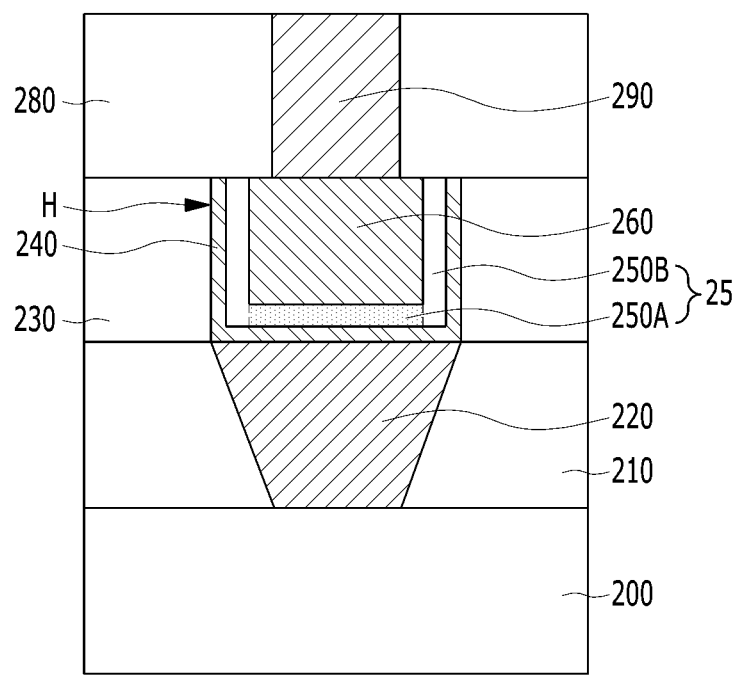
FIG. 10 is a view explaining an example of a semiconductor device and an example of a method for fabricating the same in accordance with another implementation.

FIG. 10 is a view explaining a semiconductor device and an example of a method for fabricating the same in accordance with another implementation. In the below, the differences from the above implementation will be mainly described.

First, processes similar to those described in FIGS. 1 to 3 may be performed.

Then, a conductive material may be deposited over a resultant structure. Then, a planarization process, for example, a CMP process, may be performed until the second interlayer dielectric layer 230 is exposed. As a result, a first electrode layer 240 is formed along a sidewall and a bottom surface of a hole H. Further, a variable resistance layer 25 is provided over the first electrode layer 240 and formed along the first electrode layer 240 while including a deactivated region 250A and an active region 250B. Further, a second electrode layer 260 is formed to fill in the hole H in which the first electrode layer 240 and the variable resistance layer 25 are formed. In this implementation, unlike the above implementation, all of the first electrode layer 240, the variable resistance layer 25 and the second electrode layer 260 have the vertical height not protruding from the hole H. For example, all of the first electrode layer 240, the variable resistance layer 25 and the second electrode layer 260 may be located inside the hole H. The top surfaces of the first electrode layer 240, the variable resistance layer 25 and the second electrode layer 260 may be located at the same level as the top surface of the second interlayer dielectric layer 230 in a vertical direction.

Then, a third interlayer dielectric layer 280 covering a resultant structure may be formed. Then, a second contact plug 290 penetrating through the third interlayer dielectric layer 280 and coupled to the top surface of the second electrode layer 260 may be formed.

In this implantation, since an area of the top surface of the second electrode layer 260 is relatively small, an alignment margin between the second electrode layer 260 and the second contact plug 290 may be reduced. However, since a process of forming a mask pattern for etching the second electrode layer 260 is not required, the fabricating method may be simplified.

Once again, by the above implementations, a deterioration of characteristics of a variable resistance element may be fundamentally prevented since an actual variable resistance area of the variable resistance element is not damaged during a patterning process of the variable resistance element.

The above and other memory circuits or semiconductor devices based on the disclosed technology can be used in a range of devices or systems. FIGS. 11-15 provide some examples of devices or systems that can implement the memory circuits disclosed herein.

Figure 11:
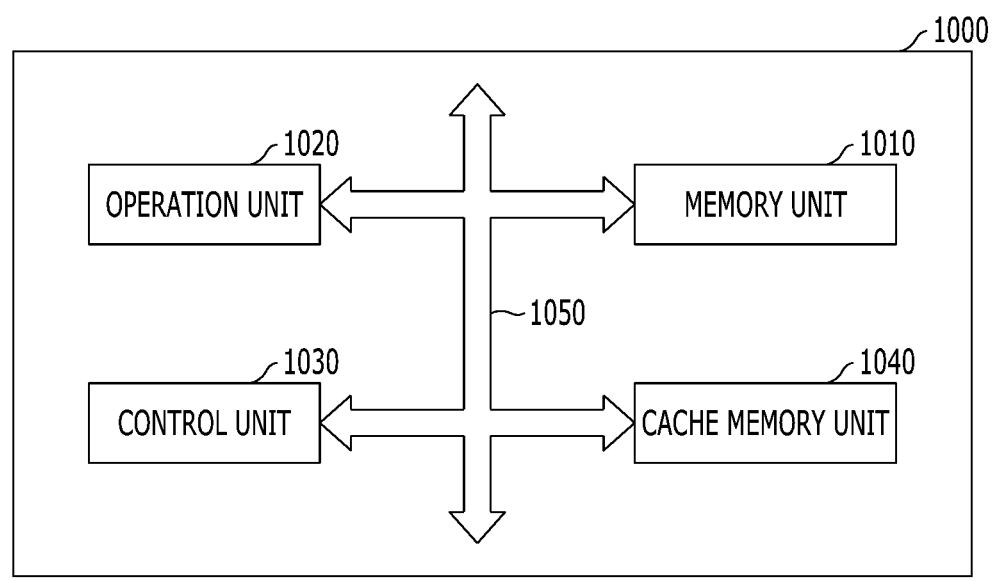
FIG. 11 is an example of a configuration diagram of a microprocessor implementing memory circuitry based on the disclosed technology.

FIG. 11 is an example of configuration diagram of a microprocessor implementing memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the memory unit 1010 may be increased and data storage characteristics of the memory unit 1010 may be improved. As a consequence, it is possible to improve operating characteristics of the microprocessor 1000 and reduce a size of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
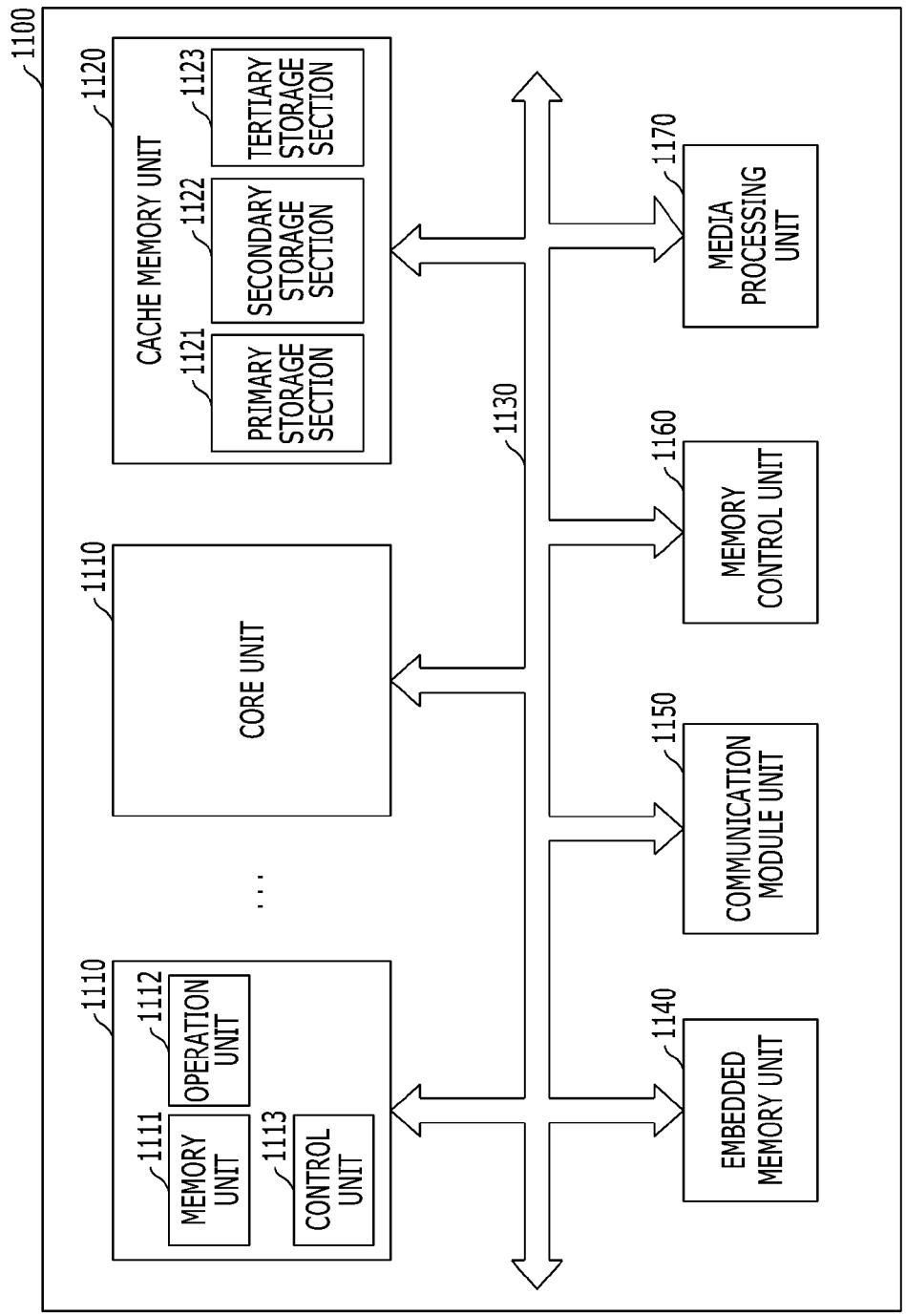
FIG. 12 is an example of a configuration diagram of a processor implementing memory circuitry based on the disclosed technology.

FIG. 12 is an example of configuration diagram of a processor implementing memory circuitry based on the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the cache memory unit 1120 may be increased and data storage characteristics of the cache memory unit 1120 may be improved. As a consequence, it is possible to improve operating characteristics of the processor 1100, and reduce a size of the processor 1100.

Although it was shown in FIG. 12 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
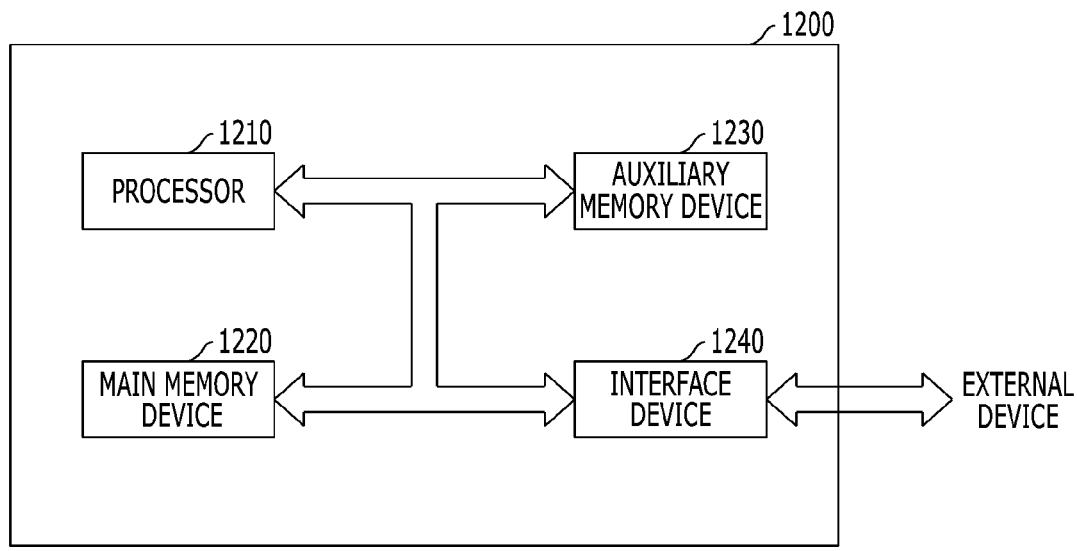
FIG. 13 is an example of a configuration diagram of a system implementing memory circuitry based on the disclosed technology.

FIG. 13 is an example of configuration diagram of a system implementing memory circuitry based on the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the main memory device 1220 may be increased and data storage characteristics of the main memory device 1220 may be improved. As a consequence, it is possible to improve operating characteristics of the system 1200 and reduce a size of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the auxiliary memory device 1230 may be increased and data storage characteristics of the auxiliary memory device 1230 may be improved. As a consequence, it is possible to improve operating characteristics of the system 1200 and reduce a size of the system 1200.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
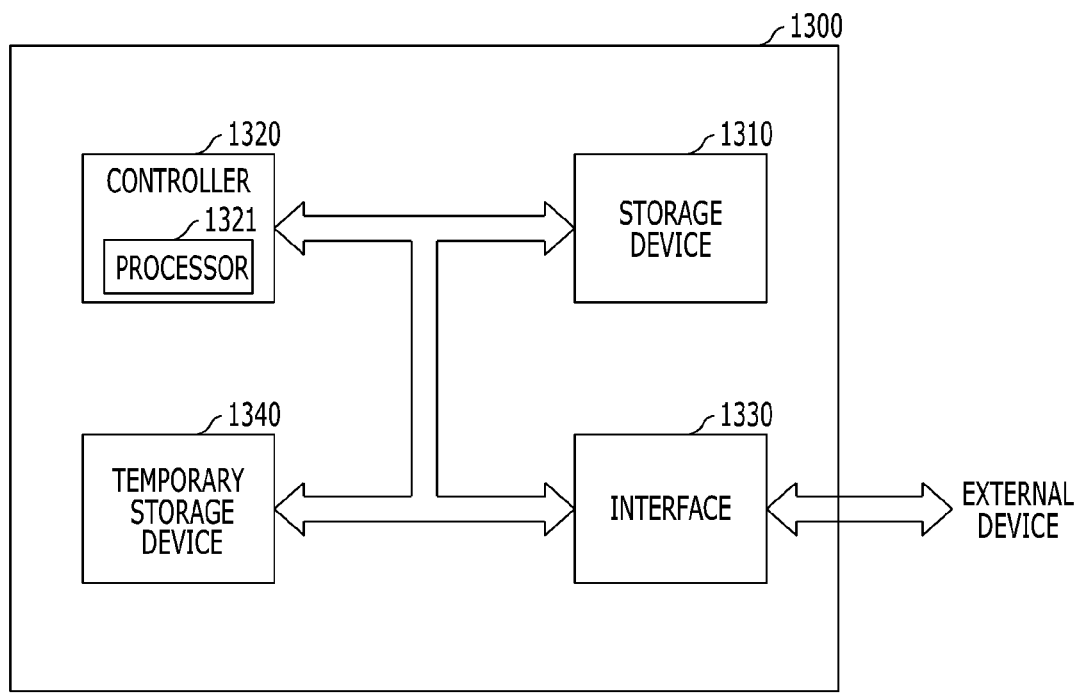
FIG. 14 is an example of a configuration diagram of a data storage system implementing memory circuitry based on the disclosed technology.

FIG. 14 is an example of configuration diagram of a data storage system implementing memory circuitry based on the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the storage device 1310 or the temporary storage device 1340 may be increased and data storage characteristics of the storage device 1310 or the temporary storage device 1340 may be improved. As a consequence, it is possible to improve operating characteristics and data storage characteristics of the data storage system 1300, and reduce a size of the data storage system 1300.

Figure 15:
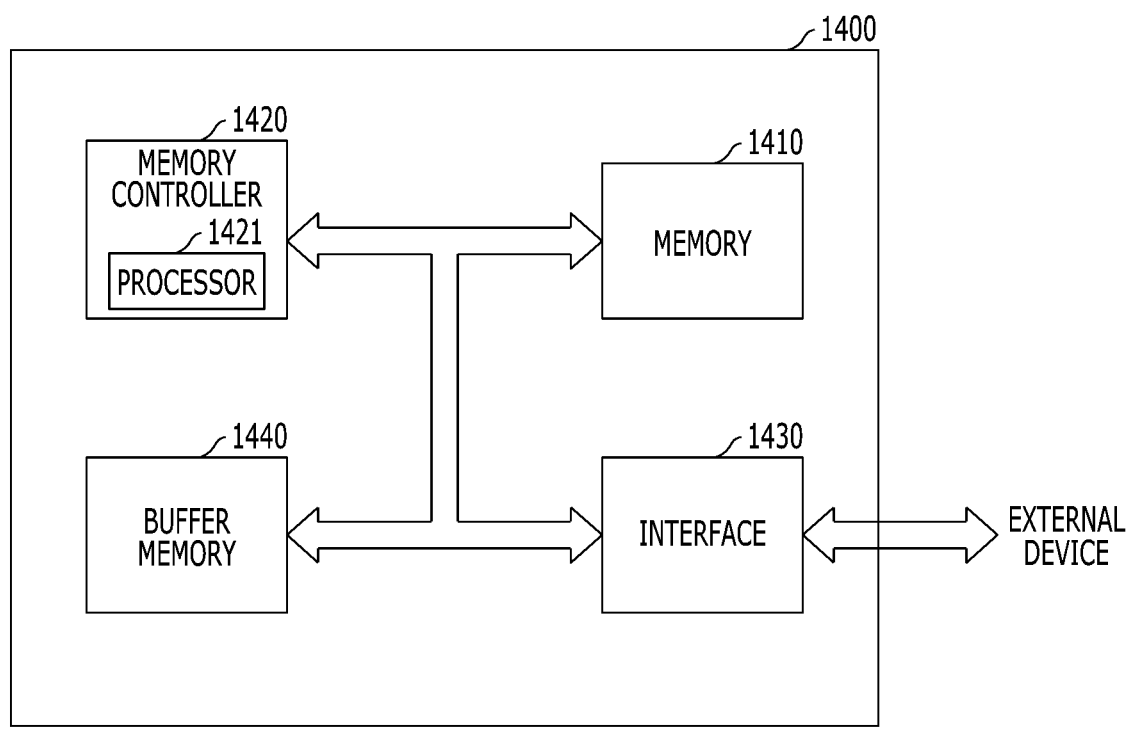
FIG. 15 is an example of a configuration diagram of a memory system implementing memory circuitry based on the disclosed technology.

FIG. 15 is an example of configuration diagram of a memory system implementing memory circuitry based on the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the memory 1410 may be increased and data storage characteristics of the memory 1410 may be improved. As a consequence, it is possible to improve operating characteristics and data storage characteristics of the memory system 1400, and reduce a size of the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first contact plug provided over a substrate; an interlayer dielectric layer located over the first contact plug and having a hole which exposes at least a portion of the first contact plug; a first electrode layer formed along a sidewall and a bottom surface of the hole; a variable resistance layer provided over the first electrode layer and formed along a top surface of the first electrode layer; and a second electrode layer filling the hole in which the first electrode layer and the variable resistance layer are formed, wherein the variable resistance layer includes a first portion which is parallel to the sidewall of the hole and has a variable resistance characteristic, and a second portion which is parallel to the bottom surface of the hole and loses the variable resistance characteristic. Through this, a degree of integration of the buffer memory 1440 may be increased and data storage characteristics of the buffer memory 1440 may be improved. As a consequence, it is possible to improve operating characteristics and data storage characteristics of the memory system 1400, and reduce a size of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

The invention claimed is:

1. An electronic device comprising a semiconductor memory, wherein the semiconductor memory includes:

a substrate;

a first contact plug formed over the substrate;

an interlayer dielectric layer located over the first contact plug and having a hole which exposes at least a portion of the first contact plug;

a first electrode layer formed along a sidewall and a bottom surface of the hole to be in contact with the first contact plug;

a variable resistance layer formed over the first electrode layer and structured to include (1) a first portion that extends along the sidewall of the hole in a direction perpendicular to the substrate and exhibits a variable resistance and (2) a second portion that is parallel to the bottom surface of the hole and does not exhibit a variable resistance; and a second electrode layer formed over the variable resistance layer.

2. The electronic device of claim 1, wherein the second portion includes a structure identical to the first portion but are added with impurities which cause a loss of the variable resistance.

3. The electronic device of claim 1, wherein the variable resistance layer includes a first magnetic layer having a pinned magnetization direction, a second magnetic layer having a variable magnetization direction, and a tunnel barrier layer interposed between the first magnetic layer and the second magnetic layer, and the second portion includes impurities which cause a loss of a magnetic characteristic in the first and second magnetic layers.

4. The electronic device of claim 3, wherein the impurities include Ga, Ge, As, In, P, C, Si, N or B.

5. The electronic device of claim 1, wherein:

the variable resistance layer includes a metal oxide, and the second portion contains more oxygen than the first portion.

6. The electronic device of claim 1, wherein the second portion satisfies a stoichiometric ratio.

7. The electronic device of claim 1, wherein the second electrode layer includes a lower portion having a sidewall and a bottom surface which are surrounded by the variable resistance layer, and an upper portion located over the lower portion and having a width greater than a width of the lower portion, and portions of the first electrode layer and the variable resistance layer which are provided over the interlayer dielectric layer are aligned on their sides with a sidewall of the upper portion of the second electrode layer.

8. The electronic device of claim 7, wherein the variable resistance layer which is located over the interlayer dielectric layer has a portion in which the variable resistance does not exist.

9. The electronic device of claim 1, wherein top surfaces of the first electrode layer, the variable resistance layer and the second electrode layer are located at a same level as a top surface of the interlayer dielectric layer.

10. The electronic device of claim 1, wherein the semiconductor memory further includes:

a second contact plug coupled to a top surface of the second electrode layer.

11. The electronic device of claim 1, wherein the first portion is switched between different resistance states according to a voltage or current supplied through the first electrode layer coupled to an outer sidewall of the first portion and the second electrode layer coupled to an inner sidewall of the first portion.

12. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

13. An electronic device comprising a semiconductor memory, wherein the semiconductor memory includes:

a substrate having a conductive layer;

an interlayer dielectric layer located over the substrate and having a hole which exposes the conductive layer;

a first electrode layer formed along a sidewall and a bottom surface of the hole to be in contact with the conductive layer;

a variable resistance layer formed over the first electrode layer and including an insulating portion which is parallel to the bottom surface of the hole and a variable resistance portion which is parallel to the sidewall of the hole; and a second electrode layer formed over the variable resistance layer.

14. The electronic device of claim 13, wherein the variable resistance portion and the insulating portion include a first magnetic layer, a second magnetic layer, and a tunnel barrier layer interposed between the first magnetic layer and the second magnetic layer, and the insulating portion further includes impurities which cause a loss of magnetic characteristics in the first and second magnetic layers.

15. The electronic device of claim 14, wherein the impurities include Ga, Ge, As, In, P, C, Si, N or B.

16. The electronic device of claim 13, wherein the variable resistance portion includes a metal oxide, and the insulating portion contains more oxygen than the variable resistance portion.

17. The electronic device of claim 16, wherein the insulating portion satisfies a stoichiometric ratio.

18. The electronic device of claim 13, wherein the first electrode layer is further provided over the interlayer dielectric layer, and the variable resistance layer further includes an additional insulating portion which is provided over the interlayer dielectric layer.

19. The electronic device of claim 18, wherein the second electrode layer includes a lower portion having a sidewall and a bottom surface which are surrounded by the variable resistance layer, and an upper portion located over the lower portion and having a width greater than a width of the lower portion, and sidewalls of portions of the variable resistance layer and the first electrode layer which are located over the interlayer dielectric layer are aligned with a sidewall of the upper portion of the second electrode layer.

20. The electronic device of claim 1, wherein the first and second portions of the variable resistance layer are formed of an identical structure which exhibits the variable resistance but are different in that the second portion includes impurities which cause a loss of the variable resistance while the first portion is substantially free of the impurities and thus maintains the variable resistance.

* * * * *